United States Patent [19]

McLaughlin

[11] Patent Number: 4,682,054
[45] Date of Patent: Jul. 21, 1987

[54] BICMOS DRIVER WITH OUTPUT VOLTAGE SWING ENHANCEMENT

[75] Inventor: Kevin L. McLaughlin, Chandler, Ariz.

[73] Assignee: Motorola, Inc., Schaumburg, Ill.

[21] Appl. No.: 879,750

[22] Filed: Jun. 27, 1986

[51] Int. Cl.$^4$ ............................................. H03K 19/01
[52] U.S. Cl. ................................... 307/446; 307/443; 307/451; 307/570; 307/270; 307/264
[58] Field of Search ............... 307/443, 446, 451, 454, 307/475, 570, 270, 264

[56] References Cited

U.S. PATENT DOCUMENTS

| | | | |
|---|---|---|---|
| 4,074,151 | 2/1978 | Buckley, III et al. | 307/451 X |
| 4,103,188 | 7/1978 | Morton | 307/570 |
| 4,301,383 | 11/1981 | Taylor | 307/446 X |
| 4,612,458 | 9/1986 | Vasseghi et al. | 307/570 X |
| 4,616,146 | 10/1986 | Lee et al. | 307/443 X |

FOREIGN PATENT DOCUMENTS

| | | | |
|---|---|---|---|
| 0132822 | 2/1985 | European Pat. Off. | 307/446 |
| 0019435 | 1/1984 | Japan | 307/446 |

OTHER PUBLICATIONS

"Merged Bipolar-CMOS Device", IBM TDB, vol. 28, No. 8, Jan. 1986, pp. 3558-3561.
Kraft et al, "Tristate Driver Utilizing Bipolar-Complementary Metal-Oxide Semiconductor Technology", IBM TDB, vol. 16, No. 8, Jan. 1974, pp. 2677-2678.
Lin et al, "Complementary MOS-Bipolar Transistor Structure", IEEE TELD, vol. ED-16, No. 11, Nov. 1969, pp. 945-951.

*Primary Examiner*—Stanley D. Miller
*Assistant Examiner*—D. R. Hudspeth
*Attorney, Agent, or Firm*—William E. Koch

[57] ABSTRACT

A BIMOS circuit is provided wherein an output terminal is coupled between an upper NPN and a lower PNP pair of push-pull transistors for providing high current drive capability along with no d.c. power dissipation. A P-channel MOS transistor is coupled between a node and both the collector of the NPN transistor and a first supply voltage terminal for biasing the NPN transistor. An N-channel MOS transistor is coupled between the node and both the collector of the PNP transistor and a second supply voltage terminal for biasing the PNP transistor. The gates of the MOS devices are connected to an input terminal. The node is further coupled to the bases of the NPN and PNP transistors and is coupled to the output terminal by a transmission gate or a resistor for increasing the output voltage swing.

4 Claims, 2 Drawing Figures

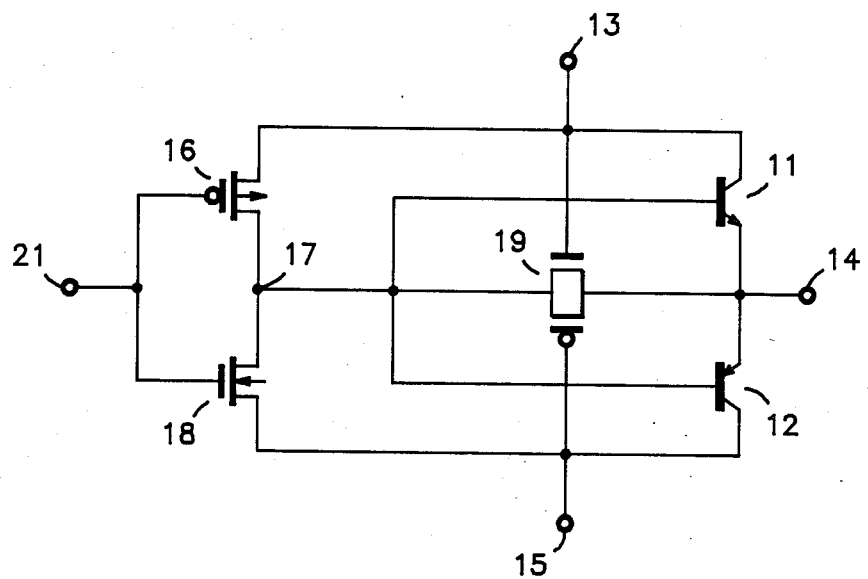
FIG. 1
FIG. 2
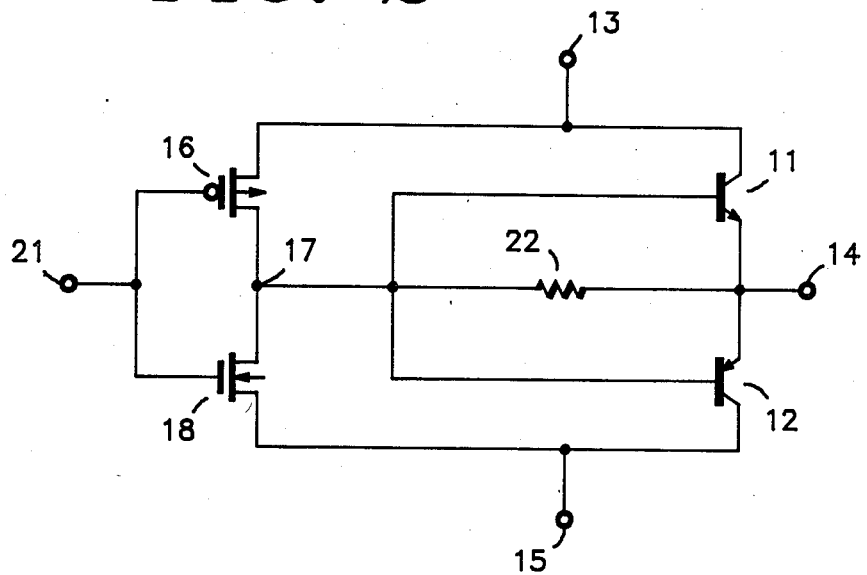

4,682,054

BICMOS DRIVER WITH OUTPUT VOLTAGE SWING ENHANCEMENT

FIELD OF THE INVENTION

This invention relates in general to semiconductor integrated circuit logic gates and, more particularly, to BIMOS logic gates having high input impedance, low power dissipation and high noise immunity of CMOS devices while maintaining the high drive capability and increased switching speed associated with bipolar devices and further providing an increased output voltage swing.

BACKGROUND OF THE INVENTION

Increased semiconductor technology has provided for the ability to fabricate a large number of semiconductor devices on one single chip. Bipolar circuits typically provide fast gate speeds, reduced delay per unit load, and have historically been the predominate technology applied in integrated circuits. CMOS (complimentary metal-oxide-semiconductor) structures provide high noise immunity, high input impedance, and low power requirements, and have rapidly gained acceptance in the industry. However, a large CMOS structure is required when driving large capacitive loads and in most cases, several stages of scaled CMOS inverters are necessary in order to minimize the total delay. For BIMOS arrays having a large number of devices, it is desirable that each CMOS device be of small size. As the size of a MOS device is reduced, the transconductance of the device and consequently the ability to drive a heavy capacitive load is also reduced. Bipolar devices continue to be used for driving these capacitive loads due to their high current gain. In quiescent periods, the bipolar push-pull transistors do not dissipate power. During transient periods, the bipolar current gain allows faster charging and discharging of capacitive loads. This results in a significant decrease in metal and fanout delays. Furthermore, smaller CMOS devices may be used in the BIMOS circuit than those required in an all-CMOS device circuit. There have been numerous attempts to combine bipolar and MOS technology to achieve all of these results in recent years.

One previously known circuit combining bipolar and MOS devices comprises a pair of push-pull NPN transistors. The upper NPN transistor has a collector connected to a first voltage source and the source of a P-channel device, an emitter connected to an output terminal and the collector of the lower NPN transistor, and a base connected to an input terminal and the gates of the P-channel device and an N-channel device. The lower NPN transistor has an emitter connected to a second voltage source and the source of the N-channel device, and a base connected to the drains of the P-channel and the N-channel devices. However, this circuit has a low impedance at the input terminal since the input terminal is connected to the base of the upper NPN transistor, and as the output switches from low to high, the lower transistor is slow to turn off causing a slow transition to the high output.

Another previously known circuit is described in U.S. patent application Ser. No. 647,216 and "BICMOS Technology for High-Performance VLSI Circuits", VLSI DESIGN, page 98, August 1984. A BIMOS circuit comprises an upper NPN transistor and a lower NPN push-pull transistor having an output terminal coupled therebetween. A P-channel device has a source and drain connected to the collector and base, respectively, of the upper transistor. An N-channel device has a source and drain connected to the collector and base, respectively, of the lower transistor. The collector and emitter of the upper and lower NPN transistors are connected to a first and second supply voltage terminal, respectively. The gates of the P-channel and N-channel devices are connected to an input terminal.

Yet another previously known circuit is described in "CMOS Digital Technology", ELECTRONIC DESIGN, page 106, Oct. 4, 1984. Upper and lower NPN push-pull transistors have an output terminal coupled therebetween. A P-channel device has a source and drain connected to the collector and base, respectively of the lower NPN transistor. An N-channel device has a drain and source connected to the base and emitter, respectively, of the lower NPN transistor. The gates of the P-channel and N-channel devices and the base of the upper NPN transistor are connected to an input terminal. Although this circuit provides high input impedance, low power dissipation, high noise immunity, and high drive capability, the switching speed is not optimum.

However, for low voltage circuits and for interfacing with other circuits having a low threshold, the output voltage swing of the previously known circuits is too small. The output voltage (logic swing) of the previously known circuits was equal to the upper supply voltage $V_{DD}$ minus the sum of the lower supply voltage $V_{SS}$ and two base-emitter voltages $V_{BE}$ (base-emitter voltage of the two NPN push-pull output transistors).

Thus, what is needed is an integrated circuit combining CMOS and bipolar technology having a high input impedance, improved switching characteristics, low power requirements, high noise immunity, high drive capability and improved power dissipation while providing a increased output voltage swing.

SUMMARY OF THE INVENTION

Accordingly, it is an object of the present invention to provide an improved BIMOS logic gate.

Another object of the present invention is to provide an improved BIMOS logic gate having an increased output voltage swing.

A further object of the present invention to provide an improved BIMOS logic gate having low power requirements.

Still another object of the present invention to provide an improved BIMOS logic gate having a high input impedance.

Another object of the present invention to provide an improved BIMOS logic gate having improved output signal switching characteristics.

Yet another object of the present invention is to provide an improved BIMOS logic gate having high drive capability.

Another object of the present invention to provide an improved BIMOS logic gate having high noise immunity.

In carrying out the above and other objects of the invention in one form, there is provided a BIMOS circuit comprising an output terminal coupled between an upper NPN and a lower PNP pair of push-pull transistors for providing high current drive capability along with no d.c. power dissipation. An P-channel MOS transistor circuit is coupled between a node and both the collector of the NPN transistor and a first supply voltage terminal for biasing the NPN transistor. An N-channel MOS transistor circuit is coupled between the node and both the collector of the PNP transistor and a second supply voltage terminal for biasing the PNP transistor. The gates of the MOS devices are connected to an input terminal. The node is further coupled to the bases of the NPN and PNP transistors and is coupled to the output terminal by a transmission gate or a resistor for increasing the output voltage swing.

The above and other objects, features, and advantages of the present invention will be better understood from the following detailed description taken in conjunction with the accompanying drawings.

BRIEF DESCRIPTION OF THE DRAWINGS

FIG. 1 is a schematic of the preferred embodiment of the present invention.

FIG. 2 is a schematic of a second embodiment of the present invention.

DETAILED DESCRIPTION OF THE INVENTION

Referring to FIG. 1, a circuit in accordance with the present invention is shown which is suitable to be fabricated in monolithic integrated circuit form. NPN transistor 11 and PNP transistor 12 comprise a pair of push-pull output transistors. Transistor 11 has its collector and emitter connected, respectively, to supply voltage terminal 13 and output terminal 14. Transistor 12 has its emitter and collector connected, respectively, to output terminal 14 and supply voltage terminal 15. Supply voltage terminal 15 is typically ground.

P-channel MOS transistor 16 has its source and drain connected, respectively, to supply voltage terminal 13 and node 17. N-channel MOS transistor 18 has its drain and source connected, respectively, to node 17 and supply voltage terminal 15. The gates of transistors 16 and 18 are connected to input terminal 21. Node 17 is further connected to the bases of transistors 11 and 12 and is coupled to output terminal 14 by transmission gate 19. The gates of transmission gate 19 are connected to supply voltage terminals 13 and 15, respectively. The gates of transmission gate 19 could alternatively be coupled to input terminal 21.

When the input signal on terminal 21 switches from a digital high to a digital low, transistors 16 and 11 are rendered conductive and the voltage on supply voltage terminal 13 is provided through transistor 11 to output terminal 14. Transistors 18 and 12 are rendered nonconductive.

When a digital high signal is applied to input terminal 21, transistors 16 and 11 will be rendered non-conductive, thereby precluding the voltage on supply voltage terminal 13 from appearing on output terminal 14. Transistors 18 and 12 will be enabled, thereby ensuring output terminal 14 will be pulled toward the potential of terminal 15.

Transmission gate 19 serves to aid transistors 11 and 12 in driving output 14 to the voltage on supply voltage terminals 13 and 15. When the input on terminal 21 is at a digital low, transistors 16 and 11 are conductive. The output on terminal 14 will rise due to transistor 11 until the base-emitter voltage of transistor 11 is reduced to less than about 0.8 volts. Transistor 11 will then become nonconductive and both transistor 16 and transmission switch 19 provide a path for the output signal on terminal 14 to reach supply voltage terminal 13. Similarly, when the input on terminal 21 is at a digital high, transistors 18 and 12 drive the output to a base-emitter voltage (transistor 12) above supply voltage terminal 15. Transistor 12 will then become nonconductive and both transistor 18 and transmission switch 19 will drive the output on terminal 14 to the voltage on supply voltage terminal 15. This full logic swing is very important to minimize power consumption in subsequent gates where the MOS thresholds are less than a base-emitter voltage. Input terminal 21 will have a high impedance since it is connected only to the gates of MOS transistors 16 and 18. Output terminal 14 will have the high current characteristics of the bipolar push-pull transistors, thereby reducing the delays associated with the long metal lines on an integrated circuit and the fan out to a number of devices which all contribute to the parasitic capacitance load on terminal 14.

Referring to FIG. 2, resistor 22 replaces transmission gate 19 of FIG. 1. The circuit of FIG. 2 functions in a similar fashion to the circuit of FIG. 1 as described above. Resistor 22 accomplishes the same objective by serving to aid transistors 11 and 12 in driving output 14 to the voltage on supply voltage terminals 13 and 15.

Although the circuits described herein illustrate NPN transistors, P-channel and N-channel MOS transistor, various combinations of PNP transistors and MOS transistors may be used in a manner known to those skilled in the art in order to accomplish the teachings of this invention. Furthermore, although only two logic gates have been described, the invention may also be used to enhance other types of gates.

The invention described herein can be used for internal circuits to improve Very Large Scale Integration (VLSI) performance as well as output drivers. In a gate array or standard cell based VLSI, the device size is uniform for ease of physical design. As a result, the delay degradation per unit load for CMOS is generally different for different circuit functions due to the difference in output impedance of various circuit configurations. For the invention described herein, the unit load degradation is practically the same for all circuit functions because the bipolar push-pull transistors isolate the CMOS circuits from the loading. This leads to ease of applications in semi-custom environments. The bipolar transistors also make ECL input/output (i.e., high performance RAM's) much easier to achieve. The invention can also be used in word line drivers, bit line drivers and sense amplifiers to improve performance.

Another application is a gate array with mixed TTL and ECL input/output on the same chip. This feature is desirable in high performance disk drives, test systems and high speed graphics applications.

By now it should be appreciated that there has been provided a BIMOS circuit having improved output voltage switching speed, low power requirements, high input impedance, high noise immunity, and high current output capability and further providing an increased output voltage swing.

I claim:
1. A circuit comprising:
   a first supply voltage terminal;
   a second supply voltage terminal;
   an input terminal;
   an output terminal;
   a first bipolar transistor coupled between said first supply voltage terminal and said output terminal and having a base coupled to a node;

a second bipolar transistor coupled between said output terminal and said second supply voltage terminal and having a base coupled to said node;

first means coupled between said first supply voltage terminal and said node and coupled to said input terminal for providing a voltage for biasing said first transistor, said first means providing a high impedance to said input terminal;

second means coupled between said node and said second supply voltage terminal and coupled to said input terminal for biasing said second transistor, aaid second means providing a high impedance to said input terminal; and a resistor coupled between said node and said output terminal.

2. A circuit comprising:
a first supply voltage terminal;
a second supply voltage terminal;
an input terminal;
an output terminal;
a first bipolar transistor coupled between said first supply voltage terminal and said output terminal and having a base coupled to a node;

a second bipolar transistor coupled between said output terminal and said second supply voltage terminal and having a base coupled to said node;

first means coupled between said first supply voltage terminal and said node and coupled to said input terminal for providing a voltage for biasing said first transistor, said first means providing a high impedance to said input terminal;

second means coupled between said node and said second supply voltage terminal and coupled to said input terminal for biasing said second transistor, said second means providing a high impedance to said input terminal; and a transmission gate coupled between said node and said output terminal, and having a first gate input and a second gate input coupled to said first and second supply voltage terminals, respectively.

3. A circuit comprising:
a first supply voltage terminal;
a second supply voltage terminal;
an input terminal;
an output terminal;
first bipolar transistor output means coupled between said first supply voltage terminal and said output terminal and coupled to a node for providing a voltage to said output terminal;

second bipolar transistor output means coupled between said output terminal and said second supply voltage terminal and coupled to said node for sinking a voltage from said output terminal;

first MOS transistor input means coupled between said first supply voltage terminal and said node and coupled to said input terminal for biasing said first bipolar transistor output means;

second MOS transistor input means coupled between said node and said second supply voltage terminal and coupled to said input terminal for biasing said second bipolar transistor output means; and a resistor coupled between said node and said output terminal.

4. A circuit comprising:
a first supply voltage terminal;
a second supply voltage terminal;
an input terminal;
an output terminal;
first bipolar transistor output means coupled between said first supply voltage terminal and said output terminal and coupled to a node for providing a voltage to said output terminal;

second bipolar transistor output means coupled between said output terminal and said second supply voltage terminal and coupled to said node for sinking a voltage from said output terminal;

first MOS transistor input means coupled between said first supply voltage terminal and said node and coupled to said input terminal for biasing said first bipolar transistor output means;

second MOS transistor input means coupled between said node and said second supply voltage terminal and coupled to said input terminal for biasing said second bipolar transistor output means; and a transmission gate coupled between said node and said output terminal, and having a first gate input and a second gate input coupled to said first and second supply voltage terminals, respectively.

* * * * *